(12) United States Patent
Kumar

(10) Patent No.: US 10,901,443 B2
(45) Date of Patent: Jan. 26, 2021

(54) CONNECTION AND DISCONNECTION DIFFERENTIAL SURGE LIMITER CIRCUIT FOR AC COUPLED TRANSCEIVER

(71) Applicant: Synopsys, Inc., Mountain View, CA (US)

(72) Inventor: Daljeet Kumar, Noida (IN)

(73) Assignee: Synopsys, Inc., Mountain View, CA (US)

( * ) Notice: Subject to any disclaimer, the term of this patent is extended or adjusted under 35 U.S.C. 154(b) by 330 days.

(21) Appl. No.: 15/946,620

(22) Filed: Apr. 5, 2018

(65) Prior Publication Data

US 2019/0204861 A1    Jul. 4, 2019

(30) Foreign Application Priority Data

Jan. 3, 2018   (IN) .............................. 201811000215

(51) Int. Cl.
| | | |
|---|---|---|
| G05F 1/569 | (2006.01) | |
| H02H 9/04 | (2006.01) | |
| H04B 10/40 | (2013.01) | |
| H01C 1/16 | (2006.01) | |
| H03K 17/082 | (2006.01) | |
| H04B 3/02 | (2006.01) | |

(52) U.S. Cl.
CPC ............... *G05F 1/569* (2013.01); *H01C 1/16* (2013.01); *H02H 9/042* (2013.01); *H03K 17/0822* (2013.01); *H04B 3/02* (2013.01); *H04B 10/40* (2013.01)

(58) Field of Classification Search
CPC .......... G05F 1/569; H02H 1/04; H02H 1/043; H02H 3/08; H02H 3/10; H02H 3/105; H02H 3/14; H02H 3/16; H02H 3/162; H02H 3/18; H02H 3/20; H02H 3/26; H02H 3/28; H02H 3/32; H02H 3/36; H02H 3/38; H02H 9/02; H02H 9/021; H02H 9/023; H02H 9/025; H02H 9/04
USPC .. 361/18, 20, 21, 42–50, 55, 56, 57, 63, 65, 361/88, 90–91.3, 93.1, 93.9
See application file for complete search history.

(56) References Cited

U.S. PATENT DOCUMENTS

| | | | |
|---|---|---|---|
| 4,586,104 | A | 4/1986 | Standler |
| 7,283,341 | B2 | 10/2007 | Lehuede |
| 7,542,255 | B2 | 6/2009 | Nakata et al. |
| 8,027,138 | B2 | 9/2011 | Maggiolino |

(Continued)

FOREIGN PATENT DOCUMENTS

| | | |
|---|---|---|
| CN | 203399102 | 1/2014 |
| CN | 204391741 | 6/2015 |

OTHER PUBLICATIONS

Marais, Hein, "RS-485/RS-422 Circuit Implementation Guide", Analog Devices, AN-960 Application Note, 2008, 12 pgs.

(Continued)

*Primary Examiner* — Nguyen Tran
(74) *Attorney, Agent, or Firm* — Jaquez Land Greenhaus LLP; Bruce W. Greenhaus, Esq.

(57) ABSTRACT

Disclosed herein are embodiments of a scalable connection and disconnection differential surge limiter circuit that may be utilized in any AC-coupled transceiver. Charge is recycled between PADP and PADN using two diode paths, hence protecting the PAD connected devices from voltage stress. The circuit can act as a protection circuit to limit the voltage on PADP and PADN during differential voltage spikes.

16 Claims, 12 Drawing Sheets

(56) References Cited

U.S. PATENT DOCUMENTS

2005/0180073 A1* 8/2005 Armer ................ H01L 27/0266
                                                    361/56
2014/0307353 A1* 10/2014 Ferri ..................... H02H 3/325
                                                    361/50
2018/0130794 A1* 5/2018 Sun ........................ H01L 27/04

OTHER PUBLICATIONS

Agilent Technologies, "Agilent HCPL-800J, Application Note 5074", pp. 1-16, Jul. 25, 2004, 16 pgs.

Markell, Richard, "Linear Technology Magazine Circuit Collection, vol. V", Linear Technology, Application Note 87, Nov. 2000, 124 pgs.

ON Semiconductor "EMI/ESD Protection Solutions for the CAN Bus", Publication Order No. AND8169/D, , Jun. 2014, Rev. 2, 15 pgs.

* cited by examiner

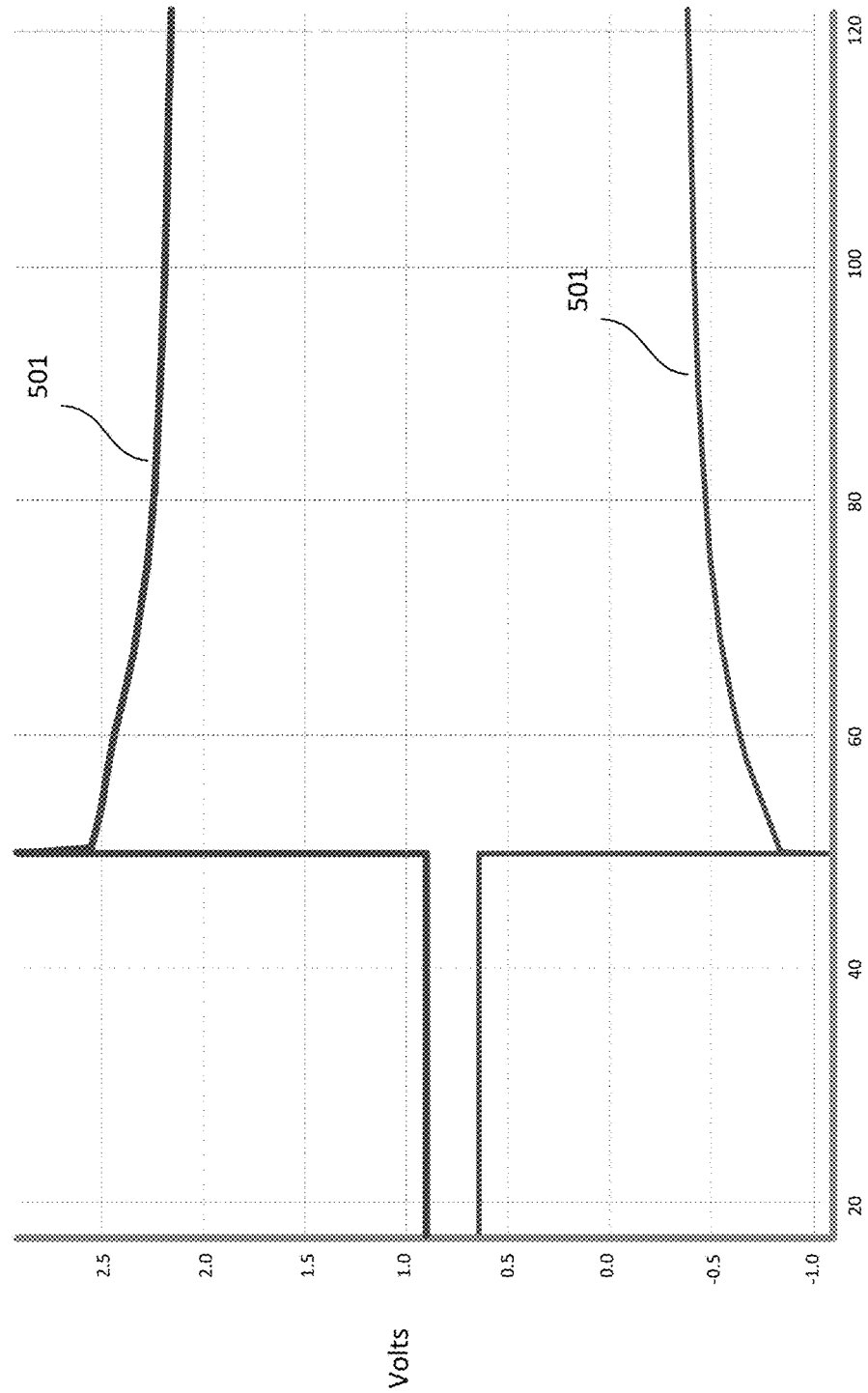

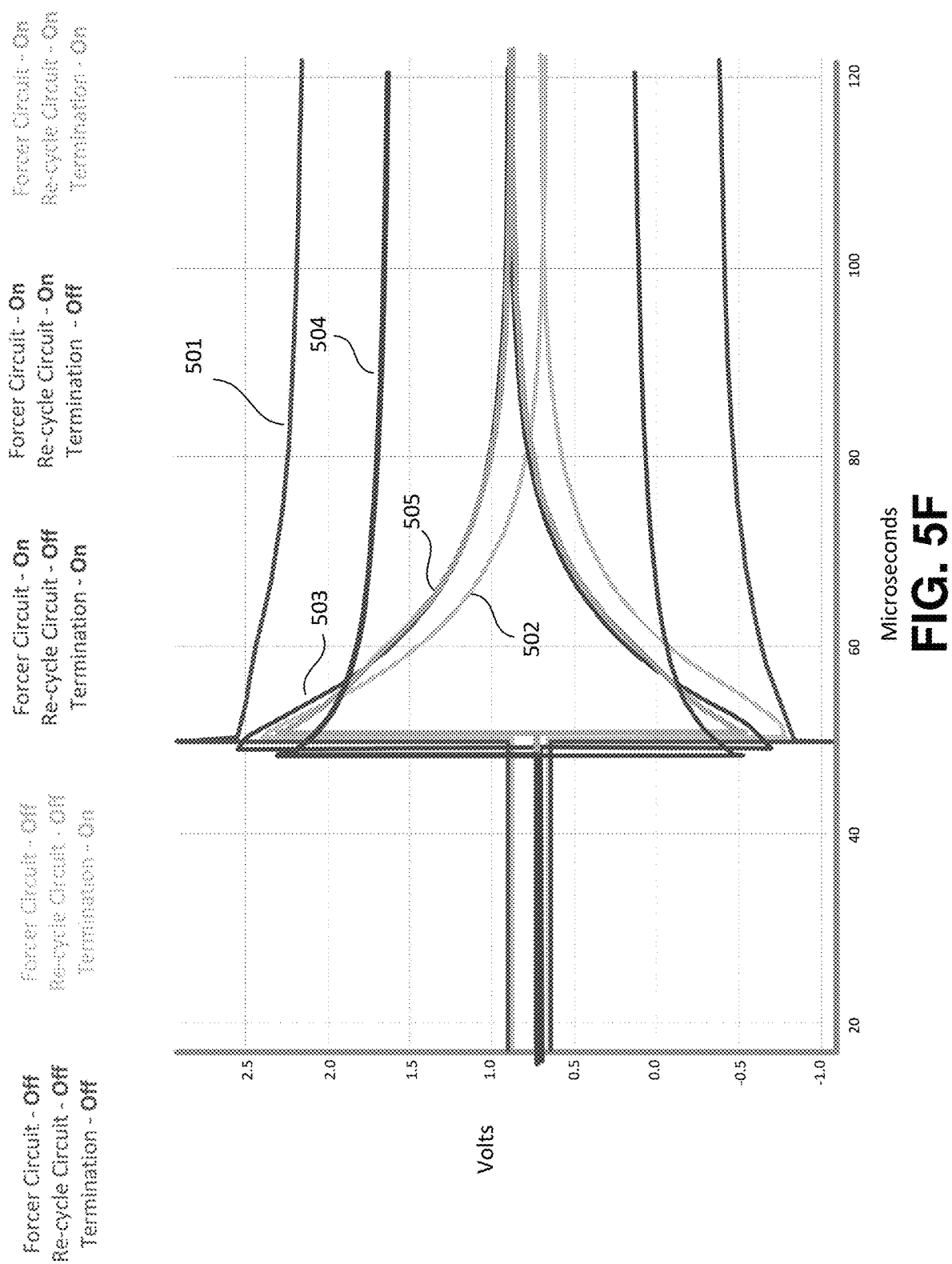

US 10,901,443 B2

CONNECTION AND DISCONNECTION DIFFERENTIAL SURGE LIMITER CIRCUIT FOR AC COUPLED TRANSCEIVER

CLAIM OF PRIORITY

This application claims the benefit of priority under 35 USC § 120 of, commonly assigned and prior Indian Application No. 201811000215, filed Jan. 3, 2018, "Connection and Disconnection Differential Surge Limiter Circuit for AC Coupled Transceiver", the disclosure of which is incorporated herein by reference in its entirety.

BACKGROUND

Voltage spikes often occur during connection and disconnection of cables to transceiver circuits. In some high-speed communication links, for example in the auxiliary (AUX) channel of a video display port, the cable connection or disconnection is detected using a combination of pull-up & pull-down resistors. When the cable is not connected, the data lines of the video display port have voltages at levels around 0V and 3V (for example). Making a connection drives the data line voltages in opposite directions, generating a large amount of charge on both the source as well as the sink. These shifts in charge and the large voltage spikes associated with them can have a damaging effect on cables and circuits.

FIG. 1 shows a device 106 that is at risk from voltage stress resulting from connecting the device 106 to an external cable, circuit or device represented by the circuitry 101. The device 106 has a positive contact pad (PADP) and a negative contact pad (PADN). The pads PADP, PADN allow the device 106 to be connected to and disconnected from the circuitry 101. Two ideal switches 102, 104, are shown ganged together (i.e., the two switches open and close together). The two switches 102, 104 are used to emulate connecting and disconnecting the device 106 from the circuitry 101. In actual operation, the device 106 may be connected or disconnected by a physical act performed by an operator, such as mating an electrical connector of the device 106 with an electrical connector provided within the circuitry 101.

The first switch 102 emulates connecting the contact pad PADP of the device 106 to the external device 101. A first reference point P1 resides on the device 106 side of the switch 102. A second reference point P2 resides on the circuitry side of the switch 102. The second switch 104 emulates the effect of connecting and disconnecting the contact pad PADN to the external circuit 101. A third reference point P4 resides on the device 106 side of the switch 104 and a fourth reference point P5 resides on the circuitry side of the switch 104.

A 0.1 megohm pull-down resistor 105 is coupled between the point P2 and ground. Similarly, a second 0.1 megohm pull-up resistor 107 is coupled between the point P4 and a voltage supply 109. Accordingly, with the device 106 disconnected from the external device 101 (i.e., switches 102, 104 being open), the voltage at the contact pad PADP will be held at ground potential and the voltage at the contact pad PADN would be held at the voltage supply potential (e.g., 3.6V).

On the other side of the switches 102, 104, a 1 megohm pull-up resistor 108 is shown coupled between point P2 and a voltage supply 110. The voltage supplies 109, 110 shown in FIG. 1 are each 3.6 volts. However, other voltages can be used. In addition, a 1 megohm pull-down resistor 118 is coupled to the point P5. In a static situation, the pull-up 108 holds the voltage at P2 at the level of the voltage supply 110 to which the pull-up 108 is connected.

In the example shown in FIG. 1, a capacitor 112 of 200 nanofarads couples the point P2 to the point P3. The point P3 is coupled to a central point (i.e., divider terminal) of a first voltage divider network. The divider network has a supply terminal coupled to a voltage supply and a ground terminal coupled to ground. The first voltage divider network 113 includes a first 100 Ohm resistor 114 coupled between the divider terminal and the power supply. A second 100 Ohm resistor 116 is coupled between the divider terminal and ground. A second 200 nanofarad capacitor 120 couples the point P5 to the point P6. The point P6 is coupled to the divider terminal of a second voltage divider network 121 that includes a first resistor 122. The first resistor 124 is coupled between the divider terminal and a voltage supply. A second resistor 126 of the second voltage divider network is coupled between the divider terminal and ground.

The point P2 is isolated from the point P5. Accordingly, any charge that is present along the circuit from P2 to the voltage divider network is isolated from the charge that is present along the circuit from P5 to the voltage divider network. Therefore, voltage increases or decreases on the circuit from the switch 102 to the first voltage divider 113 are isolated within from voltage changes on the circuit from the switch 104 to the second voltage divider 121.

As noted above, with the switches 102, 104 open, the point P1 will be pulled-down to ground and the point P4 will be pulled-up to the potential of the voltage supply 109. Similarly, the point P2 will be pulled-up to the voltage supply 110 and the voltage at point P5 will be pulled-down to ground. Accordingly, when the switches 102, 104 are closed, the difference in the charge on the two sides of the switches 102, 104 will cause a significant stress on the device 106.

FIG. 2 shows voltage curves including voltage stress peaks 202 and the voltage 204 following the stress peaks 202 that occur when the switches 102, 104 are closed. Connecting or disconnecting a cable can cause a brief, but significant voltage spike, such as the voltage stress peaks 202, which may be damaging to circuits. That is, connecting or disconnecting a cable may cause the potential difference to increase suddenly, causing the voltage stress peak 202. It should be noted that the voltages are differential in nature. Furthermore, a direct current (DC) bias point is not defined. Not having a defined DC bias point means that the voltage at the contact pads PADP, PADN can be at any voltage up to and including the voltage supply. Circuit elements experiencing a positive spike at a contact pad that starts at a voltage level that is closer to the positive voltage supply level just prior to a connection/disconnection event will experience a greater risk of damage. Likewise, if the voltage at the contact pad is closer to the negative voltage supply just prior to a connection/disconnection event, circuit elements that experience a negative spike at the contact pad are more likely to be damaged. The voltage curves shown in FIG. 2 represent various initial voltage levels for the voltage present at the contact pads PADP, PADN.

Due to the potential for damage to circuits, there is a need to reduce the large voltage spikes generated by connection and disconnection of cables to such circuits.

BRIEF SUMMARY

A scalable connection and disconnection differential surge limiter circuit is disclosed. The circuit re-cycles connection and disconnection charges that occur between data lines of the circuit. Recycling these charges reduces an effective voltage surge that otherwise occurs between the data lines of the circuit when connections with the data lines are made and broken. Hence, devices connected to the data lines are protected from voltage stresses that occur as a result of the effective voltage surge and associated charges. The disclosed circuit is scalable and may be configured for the various requirements associated with the implementation.

The disclosed circuit may be used in several situations and with many types of devices. Electrical charge is recycled between a positive contact pad (PADP) and a negative contact pad (PADN) of a device that is to be protected. The electrical charge is recycled using two diode paths. The number of diodes in each path is scalable for use with circuits having various voltage requirements. Recycling the charge (i.e., allowing current to flow between the two pads of the device) protects devices connected to the contact pads PADP, PADN from damage due to voltage stress resulting from charges that are present between the contact pads PADP, PADN. In some embodiments, a termination between the contact pads PADP, PADN is switched ON to recycle the charge that is present between the contact pads PADP, PADN. The disclosed circuit is divided into two main sub-blocks: (1) a weak resistive divider forcer circuit; and (2) a re-cycling circuit.

BRIEF DESCRIPTION OF THE DRAWINGS

To assist with identifying particular elements, the most significant digit or digits in those reference numbers that are used to identify elements within a figure, reflect the number of the figure in which the element can be found.

FIG. 5A shows the results of having the weak forcer circuits off, the recycle diode switches off and the termination switches.

FIG. 5C shows the result of having the weak forcer circuits off, the recycle diode switches off and termination switches on.

FIG. 5E shows the result of having the weak forcer circuits on, the recycle diode switches on and termination switches on.

FIG. 5F shows each of the results superimposed on one another.

DETAILED DESCRIPTION

Figure 3:
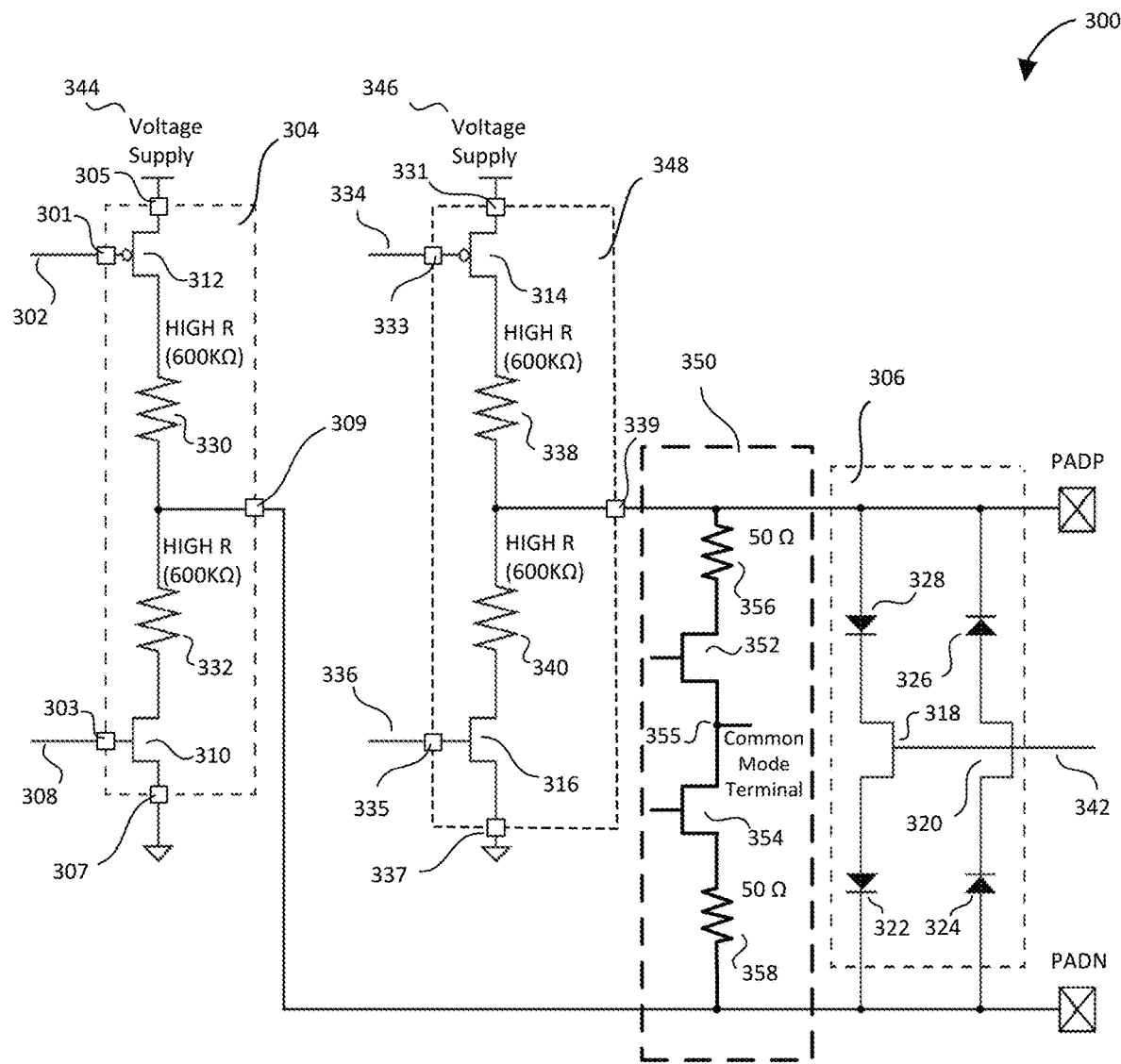
FIG. 3 illustrates a scalable connection and disconnection differential surge limiter circuit in accordance with one embodiment.

FIG. 3 is a simplified schematic of a scalable connection and disconnection differential surge limiter circuit 300. The circuit 300 includes a first forcer circuit 304, a second forcer circuit 348, a charge recycling circuit 306, a negative contact pad (PADN), and a positive contact pad (PADP). In addition, in some embodiments, the circuit 300 includes a switchable termination between PADP and PADN. In the embodiment shown in FIG. 3, a termination 350 includes two switches 352, 354 and two resistors 356, 358. In one embodiment in which the system has a characteristic impedance of 50 Ohms, each resistor 356, 358 has a resistance of 50 Ohms. The two switches 352, 354 provide a balanced switching to a common mode terminal 355 that serves as the common-mode reference point between the contact pads PADP, PADN.

The first forcer circuit 304 includes two switches 310, 312, two high resistance resistors 330, 332, a supply terminal 305, a ground terminal 307, a divider terminal 309, a first switch control port 301 and a second switch control port 303. In one embodiment, the supply terminal 305 is coupled to a voltage supply 344 and to a first terminal of the switch 312. In some embodiments, the voltage supply 344 provides a positive voltage. Alternatively, the supply terminal 305 is coupled to a negative voltage supply. The second terminal of the switch 312 is coupled to a first terminal of the first resistor 330. The second terminal of the first resistor 330 is coupled to the divider terminal 309. The second resistor 332 is coupled between the divider terminal 309 and a first terminal of the second switch 310. The second terminal of the second switch 310 is coupled to the ground terminal 307. The switch 312 is controlled by an enable signal 302 coupled to the first control port 301 and conducts when the enable signal 302 is at a logic low level (i.e., at a relative low voltage), as indicated by the "bubble" at the gate of the switch 312. The switch 310 is controlled by an enable signal 308 coupled to the second control port 303 and conducts when the enable signal 308 is at a logic high level (i.e., a relative high voltage), as indicated by the absence of a bubble at the gate of the switch 310. When the switches 310, 312 are conducting, the current though the divider network generates a voltage at the divider terminal 309 that is equal to the voltage provided by a voltage supply 344 times the ratio of the two resistors 330, 332. The divider terminal 309 is coupled to the contact pad PADN.

A second forcer circuit 348 is provided that includes two additional switches 314, 316, two additional high resistance resistors 338, 340, a supply terminal 331, a first switch control terminal 333, a second switch control terminal 335, a ground terminal 337 and a divider terminal 339. An enable signal 334 coupled to the first switch control terminal 333 controls the switch 314. When the enable signal 334 is at a logic low level, the switch 314 conducts. An enable signal 336 coupled to the second switch control terminal 335 controls the switch 316. When the enable signal 336 is at a logic high level, the switch 316 conducts. In some embodiments, the switch 312 of the first forcer circuit 304 and the switch 314 of the second forcer circuit 348 are both driven by the same enable signal 302, 334. Similarly, in some embodiments, the same enable signal drives both the switch 310 and the switch 316. In addition, in some embodiments, the enable signals 302, 334 are the inverse of the signals 308, 336. A voltage supply 346 is coupled to the supply terminal 331. When the two switches 314, 316 are conducting, a voltage is provided at the divider terminal 339 that is equal to the ratio of the two resistors 338, 340 times the voltage of the voltage supply 346. The divider terminal 339 is coupled to the contact pad PADP. In some embodiments, a single voltage supply may be used to provide the voltage for both the voltage supplies 344, 346 shown.

The switches 310, 312 activate the forcer circuit 304 when the enable signals 302, 308 cause the switches 310, 312 to conduct. When the switches 310, 312 are conducting (i.e., turned "on"), current will flow from the voltage supply to ground through a voltage divider formed by the resistors 330, 332 within the forcer circuit 304. With the value of the two resistors 330, 332 equal, a voltage, equal to half the voltage of the voltage supply 344, will be coupled to the negative contact pad PADN. In some embodiments, the resistors 330, 332, 338, 340 have a resistance of approximately 400 Kilohms. However, it will be understood by those skilled in the art that other values of resistance can be used to provide the weak voltage forcer circuits 304, 348.

In some embodiments, the charge recycling circuit 306 includes an additional two switches 318, 320, and four diodes 322, 324, 326, 328. In some embodiments, one or more of the switches 310, 312, 314, 316, 318, 320 are implemented as a MOSFET or other semiconductor implemented switch, such as a bipolar transistor. An enable signal 342 activates the switches 320, 318 and allows current to flow through diodes 328, 322, 326, 324. Accordingly, when a connection/disconnection event occurs, the difference between the voltage at the two contact pads PADP, PADN is held at no greater than the sum of the cut-in voltages of two of the diodes 328, 322 when PADP is at a higher voltage than PADN, or diodes 324, 326 when PADP is at a lower voltage than PADN.

Figure 1:
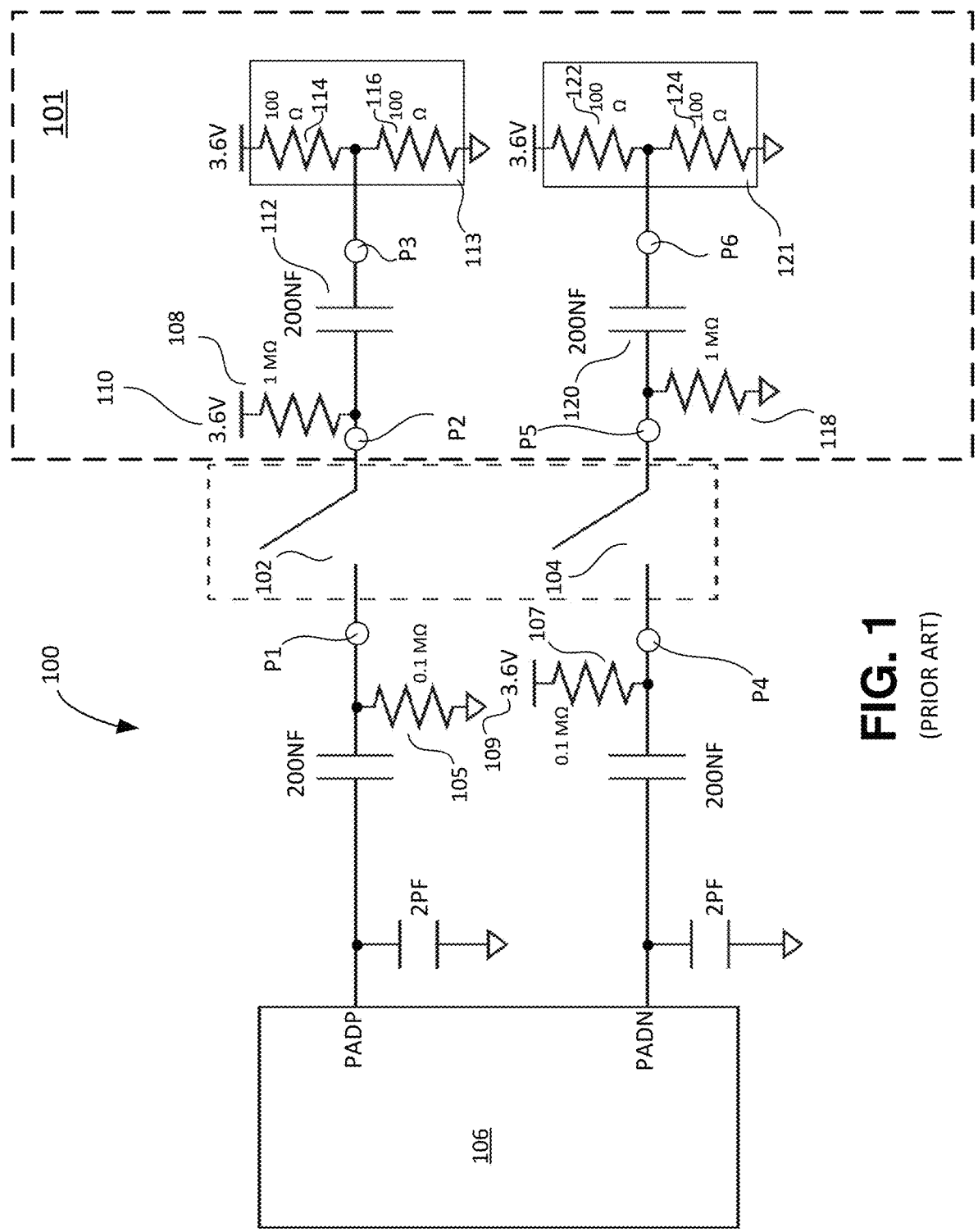
FIG. 1 shows circuit in which an ideal switch is used to emulate a connection/disconnection event that can occur between a first reference point PADP1 and a second reference point PADP2.

In the case of the device 106 shown in FIG. 1, during power-down mode, the PAD voltage may settle to any voltage between ground potential and the voltage provided by the power supply 109, depending upon the leakage currents from components within the device 106. If a connection/disconnection surge occurs at this time, one PAD voltage may rise above the voltage supply level and the second PAD voltage may fall below ground potential, hence creating appreciable voltage stress on devices connected to the contact pads PADP, PADN. Using the scalable connection and disconnection differential surge limiter circuit 300, the two forcer circuits 304, 348 maintain both the PADP and PADN voltages at one half the voltage of the voltage supply 344, 346, so that during a connection/disconnection surge, the PAD voltages each start at one half the power supply voltage. One contact pad voltage is driven towards the power supply voltage, and the other contact pad voltage is driven towards ground potential. Due to the two voltages starting at the same potential, voltage stress on the device connected to the contact pads PADP, PADN is substantially reduced.

Further assisting in limiting the swing of a connection/disconnection surge, the charge recycling circuit 306 is connected between the two contact pads PADP, PADN to ensure that the difference between the voltage at the two pads PADP, PADN is no greater than the voltage drop of two of the four diodes 322, 324, 326, 328. The diodes 322, 324, 326, 328 provide a path for current between contact pads PADP, PADN to "recycle" the charge during a connection/disconnection event. The diodes 322, 328 form a first charge recycling circuit 306 between the contact pads PADP, PADN. The anode of the first diode 328 is coupled to the positive contact pad PADP. The cathode of the second diode 322 is coupled to the negative contact pad PADN. The diodes 324, 326 form a second recycling circuit between the contact pads PADP, PADN. A switch 318 is located between the anode of the diode 322 and the cathode of the diode 328. A switch 320 is located between the anode of the diode 324 and the cathode of the diode 326. The switches 318, 320 can be turned off when a high impedance condition is desired between the contact pads PADP, PADN. In some embodiments, the same enable signal is used to control all of the switches 310, 312, 314, 316 (noting that in some embodiments, the polarity of the enable signals is inverted for some of the switches). Accordingly, the enable signal that controls the recycle circuit 306 also turns the forcer circuits 304, 348 OFF as well.

The number of diodes between the contact pads PADP, PADN may be increased or decreased. The number will depend upon the maximum voltage required on (1) the positive contact pad PADP and the negative contact pad PADN and (2) the differential voltage at which current will flow between the contact pads PADP, PADN. The size of the diodes and the nature of the switches 318, 320 play a role in determining the efficiency of the current flow during connection/disconnection events. Therefore, the diodes and switches can be sized appropriately to the implementation, as will be well known by those skilled in the art.

Figure 4:
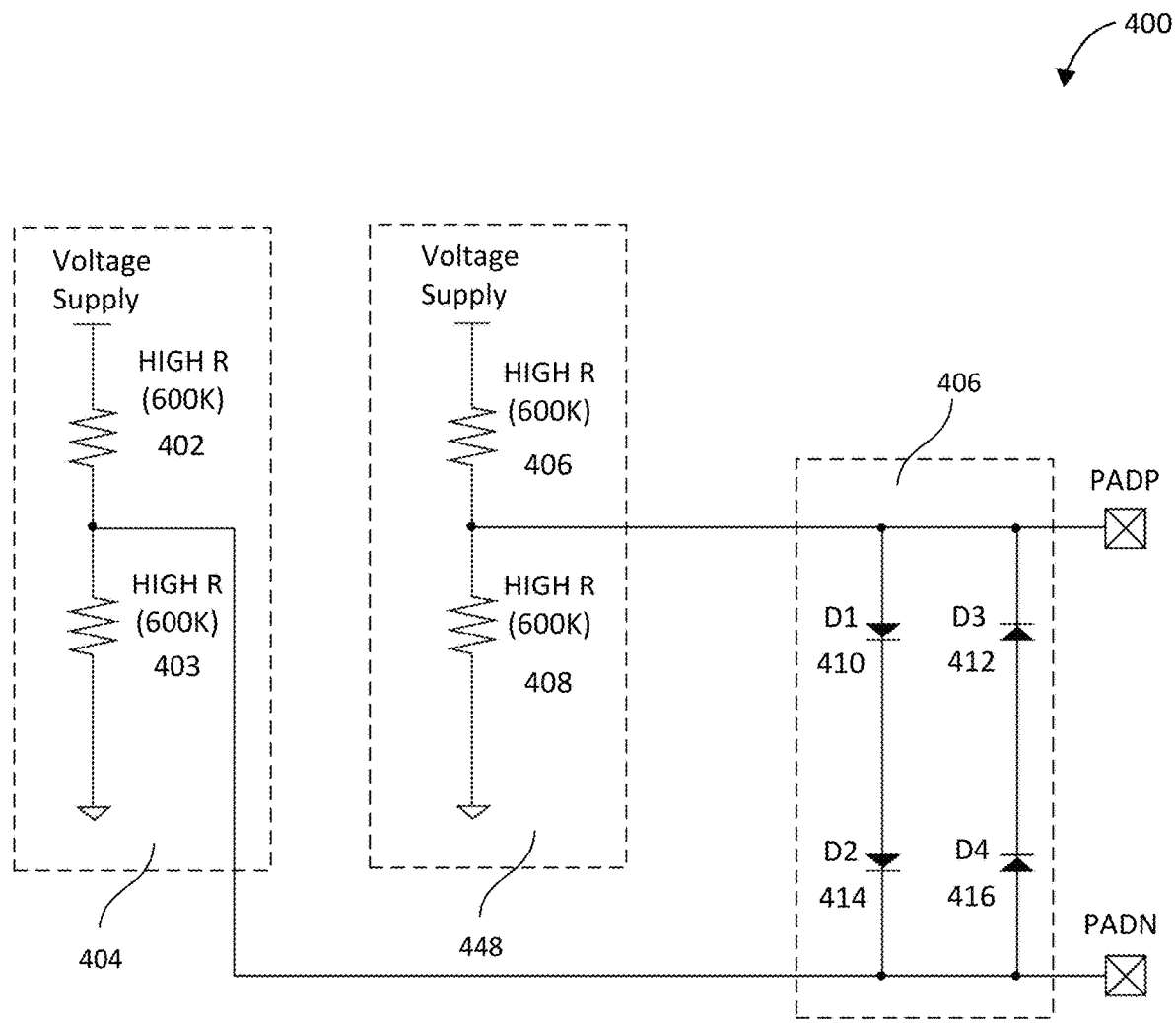
FIG. 4 illustrates an always-ON scalable connection and disconnection differential surge limiter circuit in accordance with one embodiment.

FIG. 4 is a simplified schematic of an "always-ON" charge recycling circuit 400 that includes four high resistance resistors 402, 403, 406, 408, four diodes 410, 412, 414, 416 and two contact pads PADP, PADN.

In similar fashion to the recycle circuit 306, the diodes 410, 414, 416, 412 allow current to flow between the positive contact pad 418 and the negative contact pad 420 when the difference between the voltage at one of the pads PADP, PADN is greater than the other by more than the sum of the cut-in voltages of the forward biased diodes in the path between the pads. Two high resistance resistors 406, 408 form a first voltage divider of a forcer circuit 448. An additional two high resistance resistors 402, 403 form a second voltage divider within a second forcer circuit 404. The first voltage divider establishes the voltage at which the negative contact pad 420 will be held when there is no external connection to the pad 420. The second voltage divider establishes the voltage at which the positive contact pad 418 is held when there is no external connection to the pad 418.

As shown in FIG. 4, the switches 310, 312, 314, 318, 320 shown in FIG. 3 may be eliminated if a high impedance between the positive contact pad PADP and negative contact pad PADN is not a requirement. In FIG. 4, the forcer circuits 404, 448 and charge recycling circuit 406 are always active (ON). In some embodiments, eliminating the switches in the diode paths may allow the diodes 410, 412, 414, 416 to be smaller.

Circuits 300, 400 can be used in any situation in which differential voltage surges occur during connection/disconnection events, or with any circuit in which it would be beneficial to reduce voltage stress peaks due to event-based voltage surges.

Referring to FIG. 5A-FIG. 5E, voltage values and behavior of the voltage seen at each of the two contact pads PADP, PADN are depicted for a variety of five different circuit states to show the measured effects of different aspects of the presented circuit.

FIG. 5A shows the results 501 of having the weak forcer circuits 304, 348 off (i.e., the switches 310, 312, 314, 316 all not conducting), the recycle diode switches 318, 320 off and the termination switches 352, 354 off.

Figure 5B:
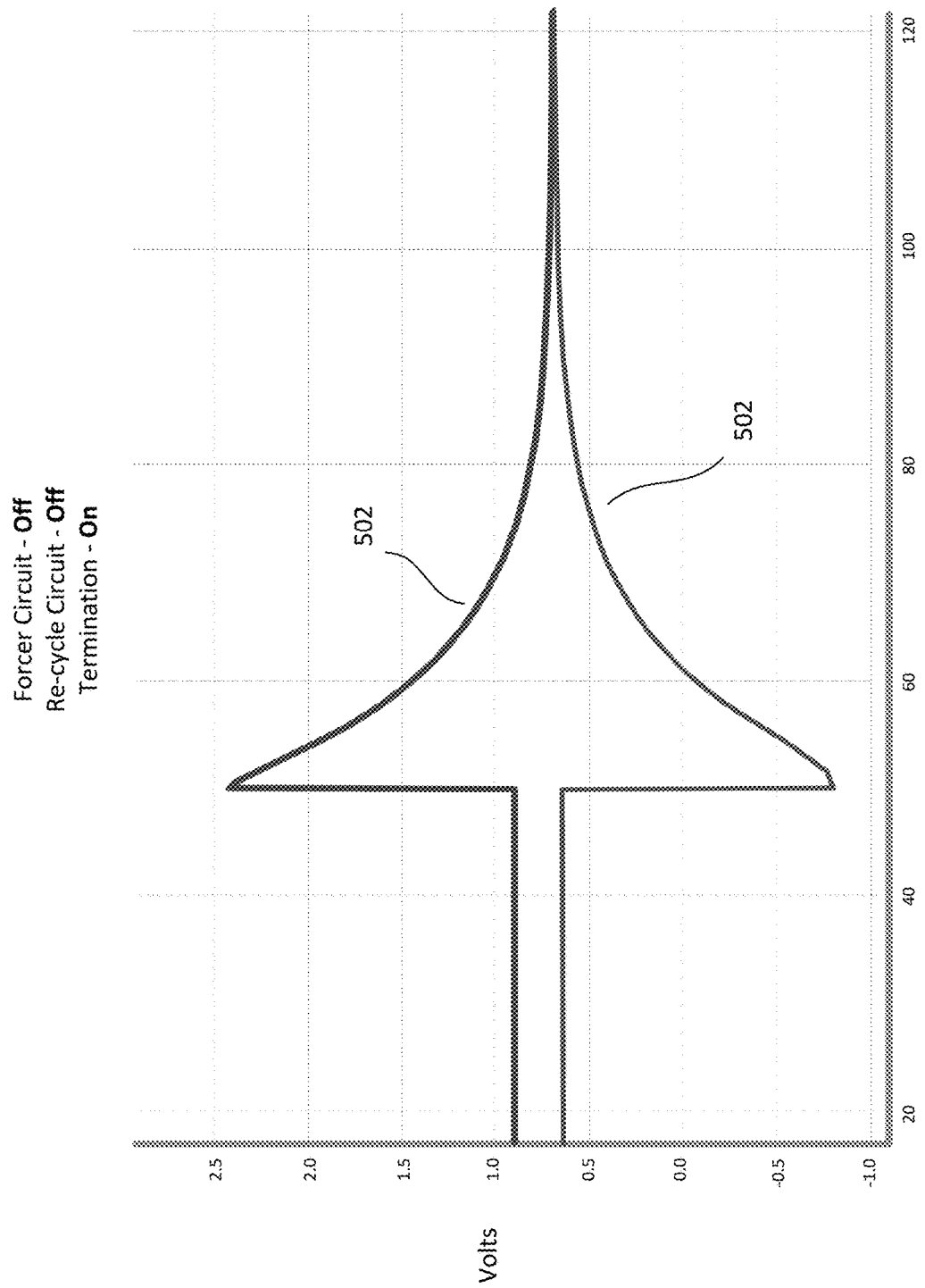
FIG. 5B shows the result of having the weak forcer circuits on, the recycle diodes switches on, and termination switches off.

FIG. 5B shows the result 502 of having the weak forcer circuits 304, 348 on, the recycle diodes switches 318, 320 on, and termination switches 352, 354 off.

Figure 5C:
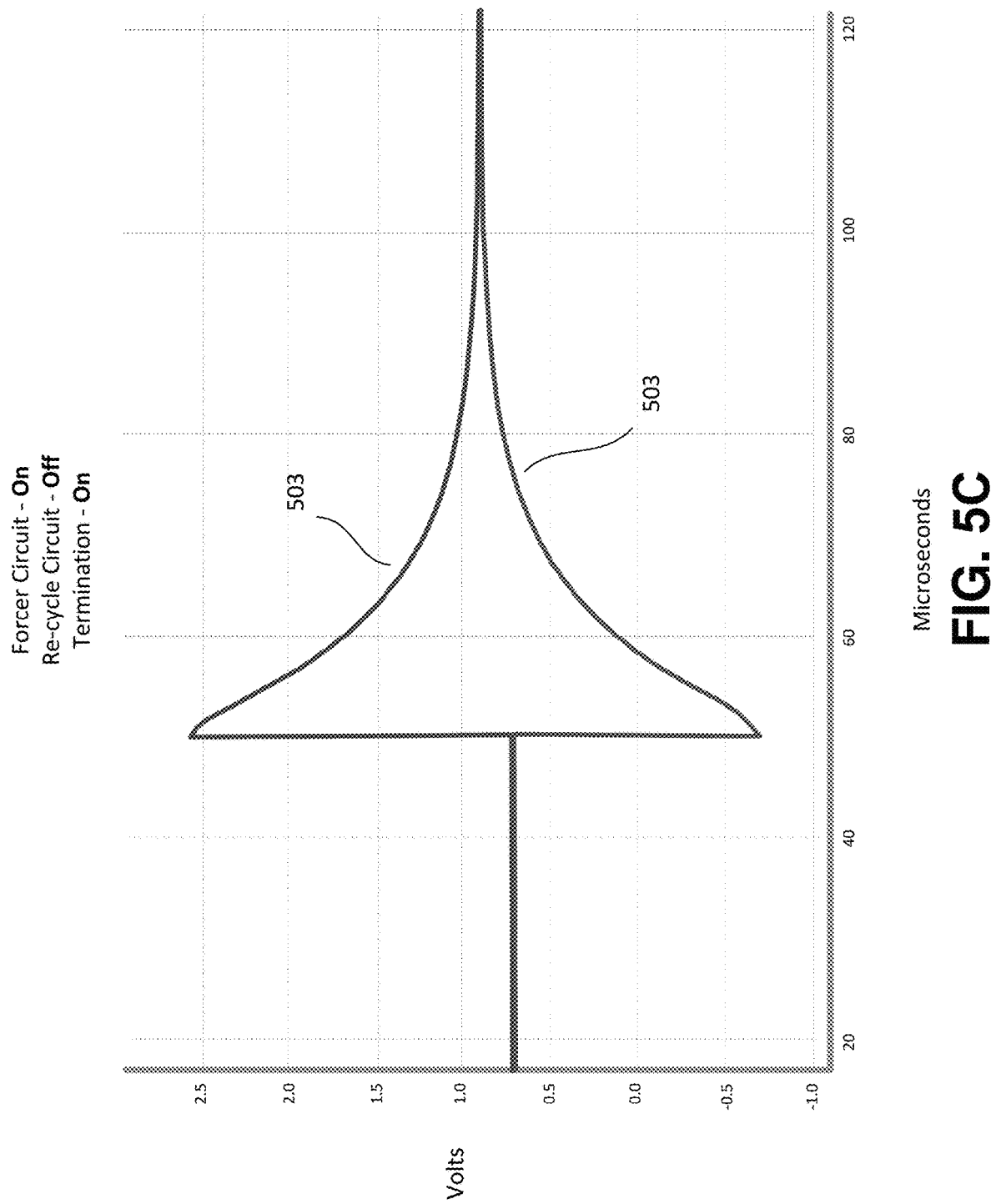

FIG. 5C shows the result 503 of having the weak forcer circuits 304, 348 off, the recycle diode switches 318, 320 off and termination switches 352, 354 on.

Figure 5D:
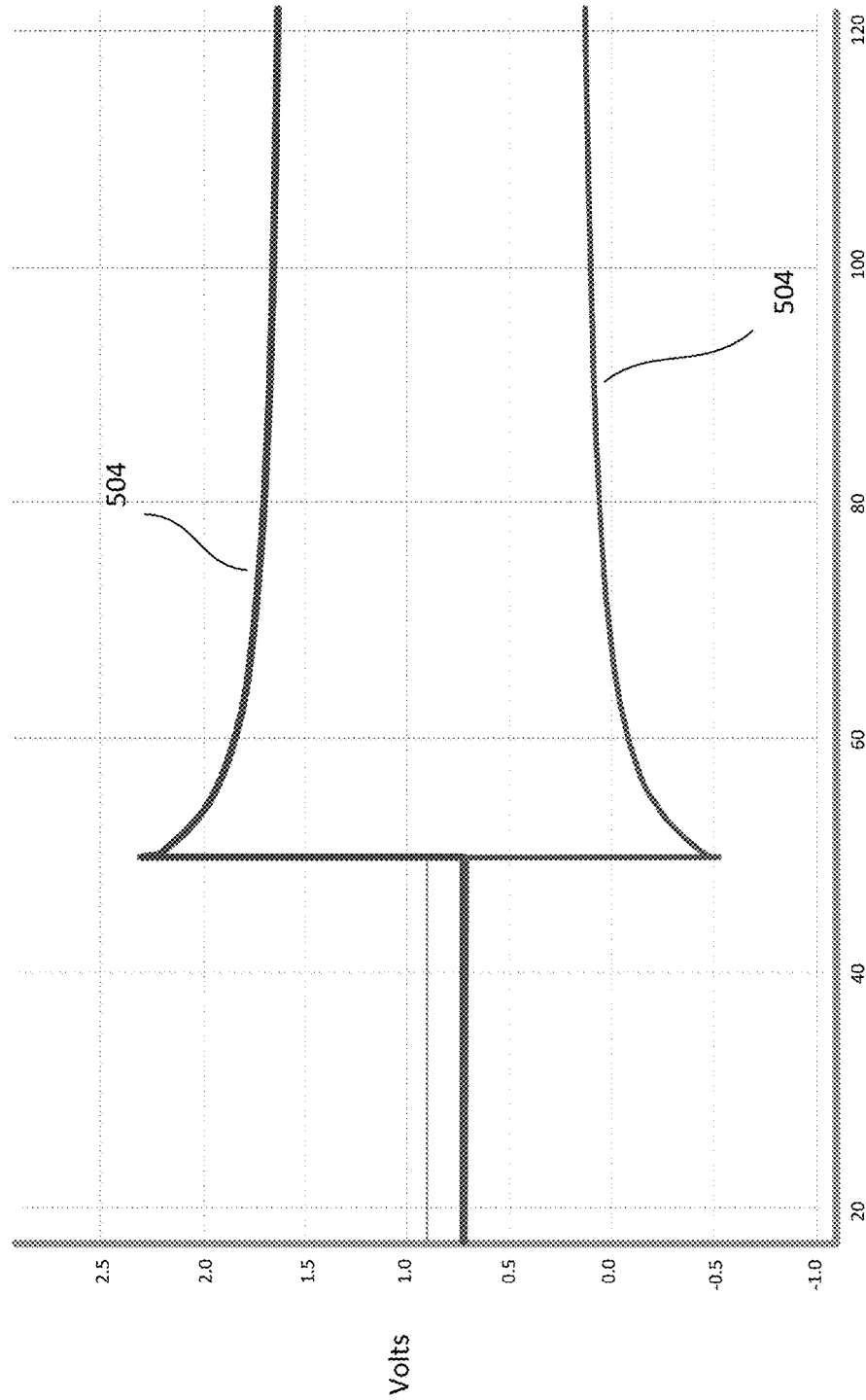
FIG. 5D shows the result of having the weak forcer circuits on, the recycle diode switches on and the termination switches off.

FIG. 5D shows the result 504 of having the weak forcer circuits 304, 348 on, the recycle diode switches 318, 320 on and the termination switches 352, 354 off.

Figure 5E:
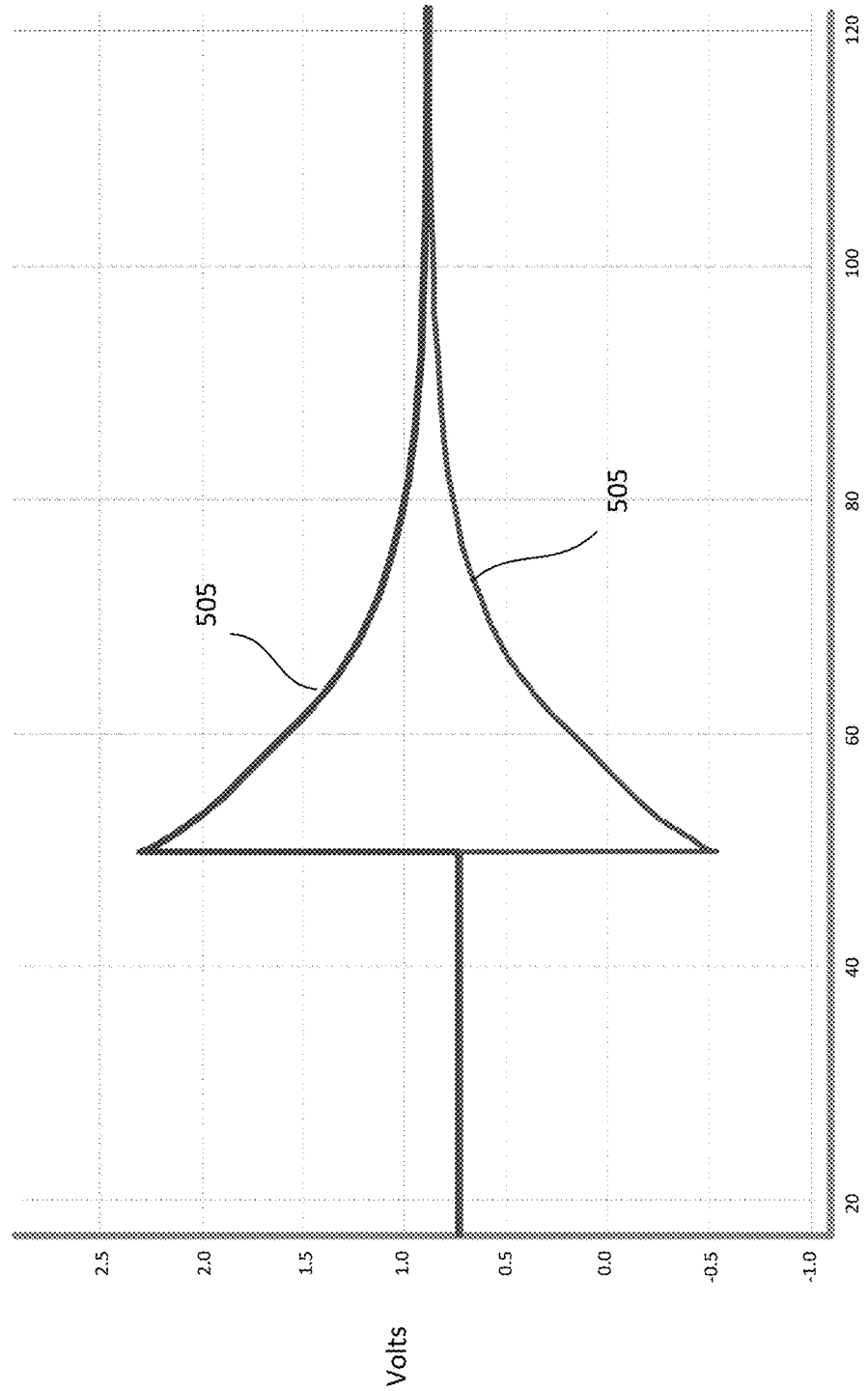

FIG. 5E shows the result 505 of having the weak forcer circuits 304, 348 on, the recycle diode switches 318, 320 on and termination switches 352, 354 on.

FIG. 5F shows each of the results 501, 502, 503, 504, 505 superimposed on one another.

It can be seen that with the forcer circuits 304, 348 off, the recycle diode switches 318, 320 off and the termination switches 352, 354 off, as shown in FIG. 5A, the results 501 are a signal that rises at the contact pad PADP to a relatively high voltage and settles to slightly lower voltage over a period of approximately 120 microseconds. It should be noted that the components values of the circuit used to determine the results 501, 502, 503, 504, 505 were consistent for each result, but that these results will be different with different values. The values used and results shown are provided merely to illustrate the relative effect of each feature of the circuit 300.

As shown in FIG. 5B, the result 502 occurs with the forcer circuits 304, 348 turn off, the recycle switches turned off and the termination switches 352, 354 turned on. It can be seen that the initial rise in voltage is substantial, however not as high as with the termination switches 352, 354 off (see FIG. 5F, for a comparison of the curves). In addition, with the termination switches 352, 354 on, the voltage drops relatively quickly. Nonetheless, the spike in the voltage that occurs is sufficient to cause significant problems (damage to some components) in some circuits.

As shown in FIG. 5C, the result 503 shows the result of turning on the forcer circuit 304, 348. However, it can be seen that just having the termination switches 352, 354 and forcer circuit switches 310, 312, 314, 316 turned on, still results in a relatively high voltage spike.

As shown in FIG. 5D, with the termination switches 352, 354 off, turning on the forcer circuits 304, 358 and the recycle diode switches 318, 320 provides the result 504. The result 504 has a lower voltage spike, but remains at a relatively high voltage level for a longer time.

As shown in FIG. 5E, the result 505 of having the forcer circuits 304, 348, the recycle diode switches 318, 320 and the termination switches 352, 354 all has both a relatively lower voltage spike as well as a faster return to a relatively low voltage level.

Figure 6:
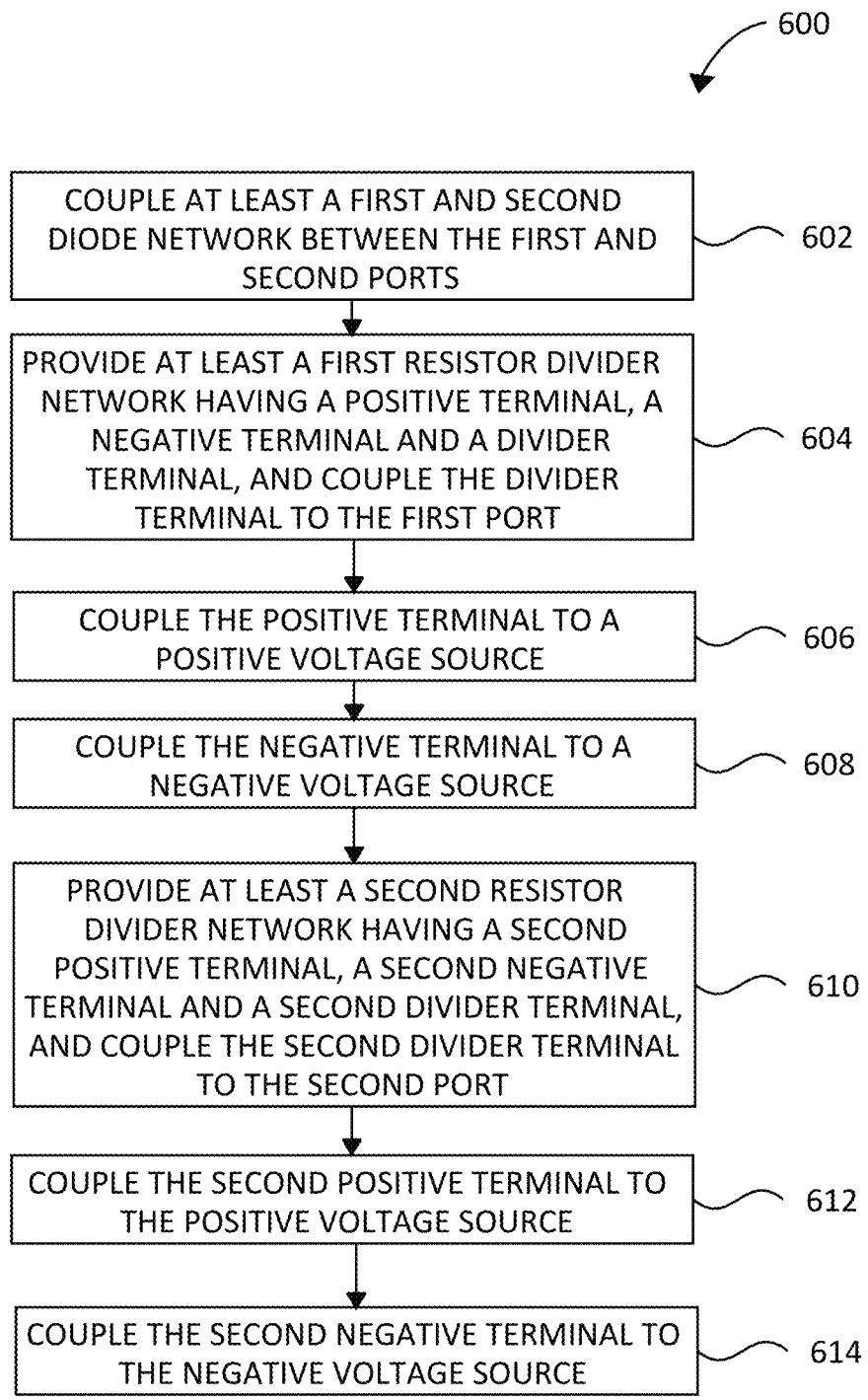
FIG. 6 illustrates an embodiment of a method in accordance with some disclosed embodiments.

FIG. 6 illustrates an embodiment of a method in accordance with some disclosed embodiments. The method 600 includes coupling at least a first and second charge recycling circuit 306 between a first and second contact pad (BLOCK 602). Coupling the charge recycling circuit may include turning on a switch within each of the charge recycling circuits. A first forcer circuit is coupled to the first contact pad (BLOCK 604). In some embodiments, the first forcer circuit includes a supply terminal, a ground terminal, and a divider terminal. A high impedance may be established between the first and second contact pads by turning off the switches in the charge recycling circuits.

The supply terminal is coupled to a voltage supply (BLOCK 606). Coupling the supply terminal of the forcer circuit to a voltage supply may include turning on switches.

The ground terminal is coupled to ground (BLOCK 608). Coupling the ground terminal of the forcer circuit to ground may include turning on switches.

The second forcer circuit is coupled to the second contact pad (BLOCK 610). In some embodiments, the second forcer circuit includes a second supply terminal, a second ground terminal and a second divider terminal.

The second supply terminal is coupled to the voltage supply (BLOCK 612). The second ground terminal is coupled to ground (BLOCK 614).

Figure 2:
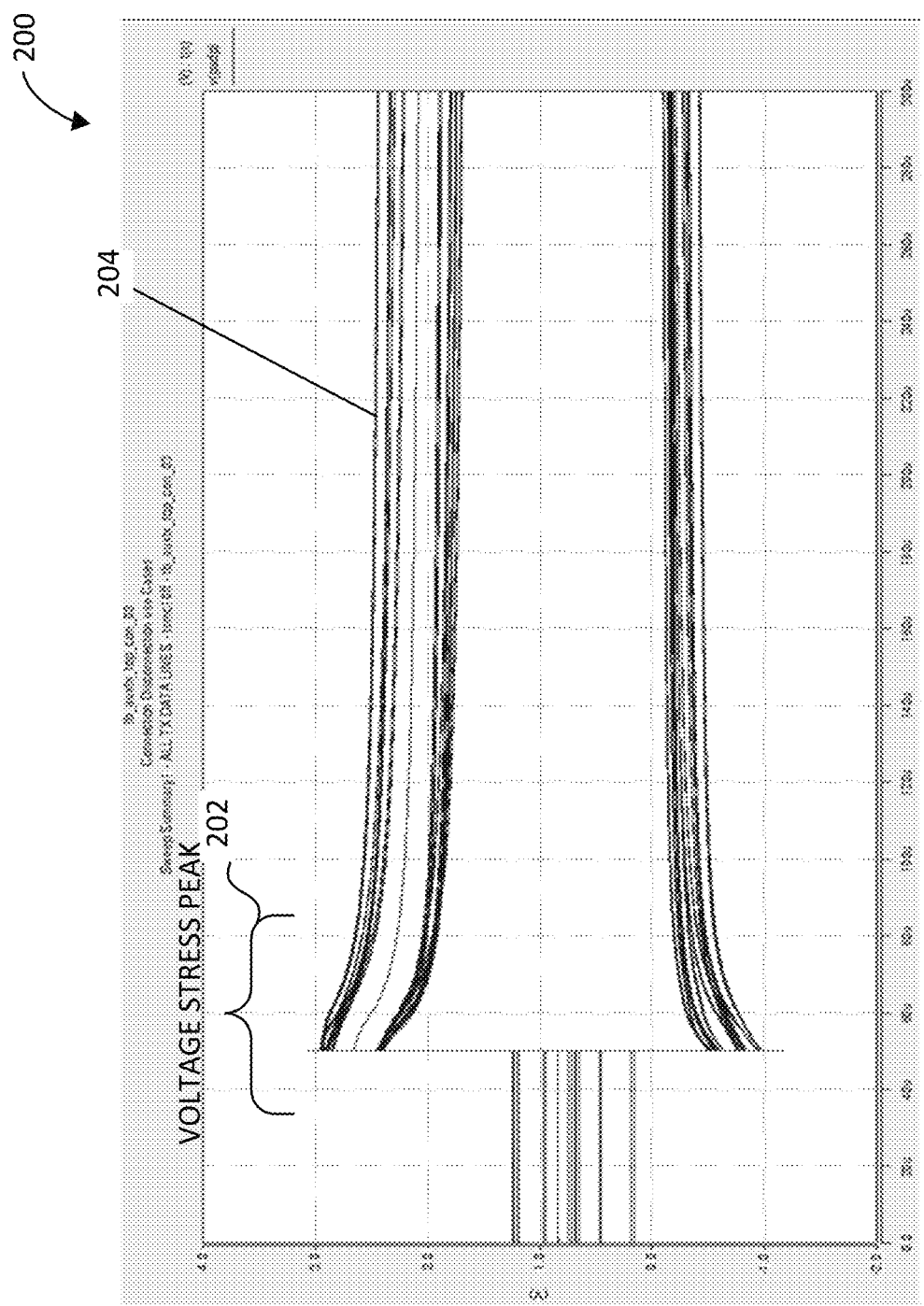
FIG. 2 illustrates voltage stress peaks resulting from connection/disconnection in the circuit of FIG. 1.
Figure 7:
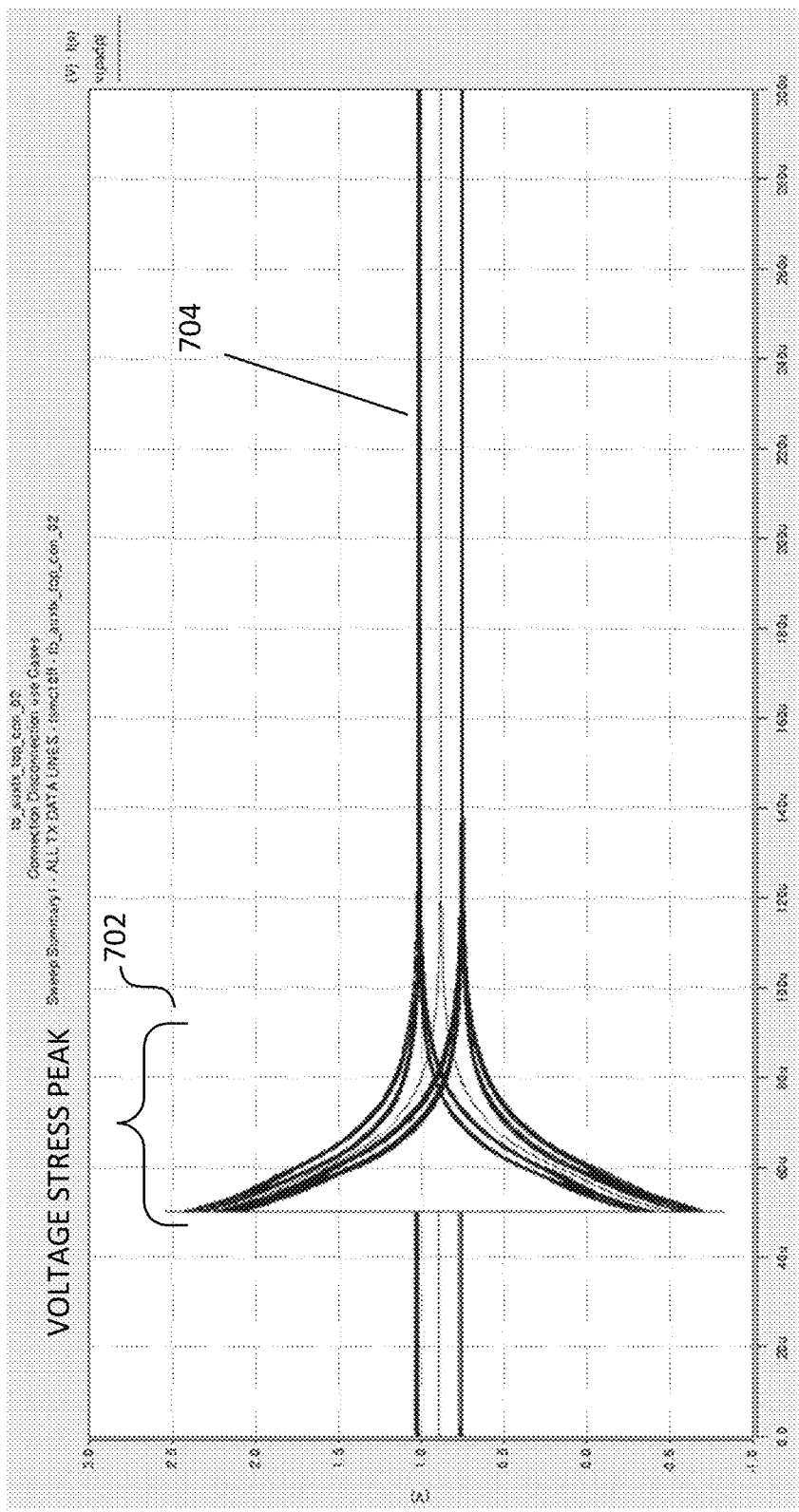
FIG. 7 illustrates an example of voltage stress peaks from a connection/disconnection event in accordance with one embodiment of the disclosed method and apparatus.

FIG. 7 is another illustration of the short-term voltage stress peaks 702 and longer-term stress peaks 704 following short-term stress peaks 702 resulting from use of the circuits shown in FIG. 3 and FIG. 4. Comparing these results with those shown in FIG. 2, it can be seen that there is a substantial benefit provided by the circuits shown in FIG. 3 and FIG. 4. The curves shown illustrate both results with and without termination.

A number of embodiments of the claimed invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the claimed invention, which is defined by the scope of the following claims, and that other embodiments are within the scope of the claims.

What is claimed is:

1. A surge limiter circuit comprising:
    at least a first and second charge recycling circuits, each coupled between a first port and a second port;
    at least a first resistor divider network having a supply terminal, a ground terminal and a divider terminal, the divider terminal coupled to the first port; and
    at least a second resistor divider network having a supply terminal, a ground terminal and a divider terminal, the divider terminal coupled to the second port;
    wherein a first and second diodes conduct a first small current, when there is no external connection to the first and second ports, such that a first voltage at the first port is determined by a ratio of a resistance of the first resistor divider, and wherein the first and second diode conduct the first current during a surge event to maintain the first voltage between the first port with respect to the second port at less than a first predetermined voltage; and
    a third and fourth diodes conduct a second small current, when there is no external connection to the first and second ports, such that a second voltage at the second port is determined by a ratio of a resistance of the second resistor divider, and wherein the third and fourth diode conduct the second current during a surge event to maintain the second voltage between the second port with respect to the first port less than a second predetermined voltage.

2. The surge limiter circuit of claim 1, wherein the supply terminals of the first and second resistor divider networks are coupled to a voltage source and a ground terminals of the first and second resistor divider are coupled to a ground.

3. The surge limiter circuit of claim 1, wherein the first predetermined voltage is equal to a sum of a forward bias diode drop of the first and second diodes and the second predetermined voltage is equal to the sum of the forward bias diode drop of the third and fourth diodes.

4. The surge limiter circuit of claim 1, wherein a voltage at a divider terminal is one half a voltage source.

5. The surge limiter circuit of claim 4, wherein the resistance in the first resistor divider network between the supply terminal and the divider terminal is approximately 600,000 Ohms and between the ground terminal and the divider terminal is approximately 600,000 Ohms.

6. The surge limiter circuit of claim 5, wherein the resistance in the second resistor divider network between the supply terminal and the divider terminal is approximately 600,000 Ohms and between the ground terminal and the divider terminal is approximately 600,000 Ohms.

7. The surge limiter circuit of claim 4 further including:
a first switch placed between the supply terminal of the first resistor divider network and the voltage source;
a second switch placed between the ground terminal of the first resistor divider network and ground
a third switch placed between the supply terminal of the second resistor divider network and the voltage source; and
a fourth switch placed between the ground terminal of the second resistor divider network and ground.

8. The surge limiter circuit of claim 7, wherein the first, second, third and fourth switches each have a control input to allow the switches to be controlled by a resistor divider control signal.

9. The surge limiter circuit of claim 8, wherein the control inputs to the first, second, third, and fourth switches receive one control signal that operates all of the switches together.

10. The surge limiter circuit of claim 9, wherein at least one of the first, second, third, and fourth switches are transistors.

11. The surge limiter circuit of claim 9, wherein at least one of the first, second, third, and fourth switches is a field effect transistor (FET).

12. The surge limiter circuit of claim 9, wherein:
the first charge recycling circuit includes a first and second diodes, each having a cathode and an anode, the cathode of the first diode coupled to the first port, the anode of the first diode being coupled to the cathode of the second diode and the anode of the second diode being coupled to the second port;
the second charge recycling circuit includes a third and fourth diodes, each having a cathode and an anode, the anode of the third diode coupled to the first port and the cathode of the third diode being coupled to the anode of the fourth diode and the cathode of the fourth diode being coupled to the second port.

13. The surge limiter circuit of claim 12, wherein the voltage of the second port with respect to the first port is maintained less than a sum of a forward biased diode drop of the first and second diodes and wherein the voltage of the first port with respect to the second port is less than the sum of the forward biased diode drop of the third diode with the fourth diode.

14. The surge limiter circuit of claim 12, further including the first switch coupled between the anode of the first diode and the cathode of the second diode and the second switch coupled between the cathode of the third diode and the anode of the fourth diode.

15. The surge limiter circuit of claim 8, wherein the control inputs of at least the first and second switches receives a first control signal that operates both switches together and the third and fourth switch receives a second control signal that operates both switches together.

16. A surge limiter circuit, including:
a first port;
a second port;
a first diode having a cathode connected to the first port;
a second diode having an anode connected to the first port;
a third diode having cathode connected to the anode of the first diode and having an anode connected to the second port;
a fourth diode having an anode connected to the cathode of the second diode and a cathode connected to the second port;
a first weak resistive divider including:
a first divider terminal coupled to a voltage source and to a first terminal of a first resistance,
a second divider terminal coupled to a ground and to ft first terminal of a second resistance; and
a third divider terminal coupled to a second terminal of the first resistance, a second terminal of the second resistance and to the first port; and
a second weak resistive divider including:
a fourth divider terminal coupled to the voltage source and to a first terminal of a third resistance;
a fifth divider terminal coupled to ground and to a first terminal of a fourth resistance; and
a sixth divider terminal coupled to a second terminal of the third resistance, the second terminal of the fourth resistance and to the second port.

* * * * *